US008013775B2

(12) United States Patent
Woods

(10) Patent No.: US 8,013,775 B2
(45) Date of Patent: Sep. 6, 2011

(54) RADIO FREQUENCY ABSORBER

(75) Inventor: Charles E. Woods, Gilbert, AZ (US)

(73) Assignee: ViaSat, Inc., Carlsbad, CA (US)

(*) Notice: Subject to any disclaimer, the term of this patent is extended or adjusted under 35 U.S.C. 154(b) by 636 days.

(21) Appl. No.: 11/742,268

(22) Filed: Apr. 30, 2007

(65) Prior Publication Data

US 2008/0266830 A1   Oct. 30, 2008

(51) Int. Cl.
*H01Q 17/00* (2006.01)

(52) U.S. Cl. .................................. 342/1; 342/4

(58) Field of Classification Search ............... 342/1–4; 455/90.3, 128, 347; 361/142, 600, 679.01, 361/750, 816; 340/693.5; 439/76.1, 607.01, 439/607.13
See application file for complete search history.

(56) References Cited

U.S. PATENT DOCUMENTS

| | | | | |
|---|---|---|---|---|
| 3,307,186 A | * | 2/1967 | Straub | 342/4 |
| 3,431,348 A | * | 3/1969 | Lamp et al. | 174/389 |
| 4,381,510 A | * | 4/1983 | Wren | 343/909 |
| 4,638,271 A | * | 1/1987 | Jecko et al. | 333/205 |
| 4,906,998 A | * | 3/1990 | Shibuya | 342/4 |
| 5,047,296 A | * | 9/1991 | Miltenberger et al. | 428/813 |
| 5,275,880 A | * | 1/1994 | Boyer et al. | 428/328 |
| 5,627,541 A | * | 5/1997 | Haley et al. | 342/1 |
| 6,041,224 A | * | 3/2000 | Wada | 455/327 |
| 6,335,699 B1 | * | 1/2002 | Honma | 342/4 |
| 6,496,138 B1 | * | 12/2002 | Honma | 342/70 |
| 6,531,985 B1 | * | 3/2003 | Jones et al. | 343/702 |
| 6,778,042 B2 | * | 8/2004 | Terashima et al. | 333/205 |
| 6,822,541 B2 | * | 11/2004 | Sue et al. | 333/247 |
| 6,919,387 B2 | * | 7/2005 | Fujieda et al. | 523/137 |
| 6,933,881 B2 | * | 8/2005 | Shinoda et al. | 342/70 |
| 6,937,184 B2 | * | 8/2005 | Fujieda et al. | 342/70 |
| 7,126,525 B2 | * | 10/2006 | Suzuki et al. | 342/70 |
| 7,136,008 B2 | * | 11/2006 | Aisenbrey | 342/4 |
| 7,239,261 B2 | * | 7/2007 | Fujieda et al. | 342/1 |
| 7,342,468 B2 | | 3/2008 | Lopez et al. | |

(Continued)

FOREIGN PATENT DOCUMENTS

| | | |
|---|---|---|
| DE | 1441872 | 4/1969 |
| EP | 0769823 | 4/1997 |
| EP | 1089374 | 4/2001 |

(Continued)

OTHER PUBLICATIONS

Microwave Absorbing Material—ARC Technologies—radar absorbing structures, http://www.arc-tech.com/honeycomb_absorbers.html, copyright 2004, 2 pgs.

(Continued)

*Primary Examiner* — Thomas H Tarcza
*Assistant Examiner* — Peter Bythrow
(74) *Attorney, Agent, or Firm* — Snell & Wilmer LLP

(57) ABSTRACT

An exemplary embodiment of the present invention comprises a radio frequency absorber that is operative for absorbing electromagnetic energy, scattering electromagnetic signals, and/or attenuating electromagnetic signals. In accordance with certain aspects of the invention, the radio frequency absorber is substantially flat and comprises an absorbing surface. The absorbing surface is operative to absorb electromagnetic energy, scatter electromagnetic signals, and/or attenuate electromagnetic signals. In exemplary embodiments of the invention, the radio frequency absorber comprises a plurality of holes disposed within the radio frequency absorber. The radio frequency absorber, according to various embodiments of the present invention, is configured to reduce cavity oscillations and/or cavity modes and resonances within an integrated circuit device, such as a device that houses a monolithic microwave integrated circuit.

34 Claims, 8 Drawing Sheets

U.S. PATENT DOCUMENTS

| | | | |
|---|---|---|---|
| 7,408,500 B2 * | 8/2008 | Shinoda et al. | 342/70 |
| 7,420,500 B2 * | 9/2008 | Treen et al. | 342/4 |
| 2003/0232603 A1 * | 12/2003 | Tanaka et al. | 455/90.3 |
| 2004/0248742 A1 * | 12/2004 | Terashima et al. | 505/210 |
| 2005/0035896 A1 * | 2/2005 | Fujieda et al. | 342/1 |
| 2005/0128134 A1 * | 6/2005 | Shinoda et al. | 342/70 |

FOREIGN PATENT DOCUMENTS

| | | |
|---|---|---|
| GB | 2283856 | 5/1995 |
| JP | 03209905 | 9/1991 |
| JP | 08288707 | 11/1996 |
| JP | 09238002 | 9/1997 |
| JP | 11122006 | 4/1999 |
| JP | 11-233660 | 8/1999 |

OTHER PUBLICATIONS

Emerson & Cuming Microwave Products: Microwave absorbers and low loss dielectrics, http://www.eccosorb.com/catalog/eccosorb/HC.asp (1 of 2) Apr. 30, 2007, 2 pgs.

RF Products, A Laird Technologies Company, Microwave Absorbing Materials, 24 pgs.

ISR and Written Opinion from corresponding PCT application (PCT/US2008/051731) dated Aug. 19, 2008.

International Search Report and Written Opinion dated Aug. 19, 2008.

International Preliminary Report on Patentability dated Apr. 28, 2008.

Non-Final Office Action dated Jul. 20, 2006—U.S. Appl. No. 10/906,900.

Non-Final Office Action dated Jan. 16, 2007—U.S. Appl. No. 10/906,900.

Final Office Action dated Aug. 15, 2007—U.S. Appl. No. 10/906,900.

European Office Action dated Dec. 21, 2007, Application No. 06717656.0.

* cited by examiner

RADIO FREQUENCY ABSORBER

FIELD OF INVENTION

The present invention relates to a radio frequency absorber. More specifically, the invention relates to a radio frequency absorber that comprises holes disposed within the radio frequency absorber.

BACKGROUND OF THE INVENTION

Radio frequency absorbers may be used in many applications where it is desirable to absorb, attenuate, scatter, and otherwise modify radio frequency signals incident on a surface. For example, radio frequency absorbers have been used within integrated circuit devices, on antennas, on objects subject to radar detection that may have a radar cross section, and on many other surfaces subject to electromagnetic radiation. Within integrated circuit devices having device cavities, the radio frequency absorbers may aid in reducing cavity modes and resonances and preventing undesirable feedback and power loss.

Such currently-known radio frequency absorbers are effective at absorbing electromagnetic energy carried by the radio frequency signals where the frequency is below 18 GHz. However, in certain applications, for example, within a device that houses an integrated circuit, where the frequency rises above 18 GHz, the currently-known radio frequency absorbers become less effective. At these higher frequencies, currently-known radio frequency absorbers become less absorptive and more reflective, and do not function to reduce cavity modes and resonances, feedback, and power loss.

SUMMARY OF THE INVENTION

The present invention generally relates to a radio frequency absorber. An exemplary embodiment of the present invention comprises a radio frequency absorber that is operative for absorbing electromagnetic energy, scattering electromagnetic signals, and/or attenuating electromagnetic signals. In accordance with certain aspects of the invention, the radio frequency absorber is substantially flat and comprises an attachment surface and an absorbing surface. The attachment surface may be used to secure the radio frequency absorber to a material such as a device housing. The absorbing surface is operative to absorb electromagnetic energy, scatter electromagnetic signals, and/or attenuate electromagnetic signals. In exemplary embodiments of the invention, the radio frequency absorber comprises a plurality of holes disposed within the radio frequency absorber. The radio frequency absorber, according to various embodiments of the present invention, is configured to reduce cavity oscillations and/or cavity modes and resonances within an integrated circuit device, such as a device that houses a monolithic microwave integrated circuit.

BRIEF DESCRIPTION OF THE DRAWINGS

A more complete understanding of the present invention may be derived by referring to the detailed description and claims when considered in connection with the drawing Figures, wherein like reference numbers refer to similar elements throughout the drawing Figures.

DETAILED DESCRIPTION

While the exemplary embodiments herein are described in sufficient detail to enable those skilled in the art to practice the invention, it should be understood that other embodiments may be realized and that mechanical, electrical, chemical and/or other changes may be made without departing from the spirit and scope of the invention. Thus, the following detailed description is presented for purposes of illustration only and not of limitation.

Figure 1C:
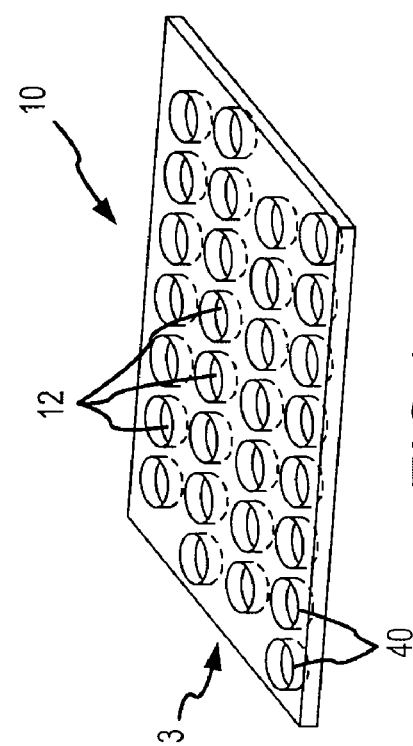
FIG. 1c illustrates a perspective view of a radio frequency absorber according to yet another exemplary embodiment of the present invention.
Figure 1A:
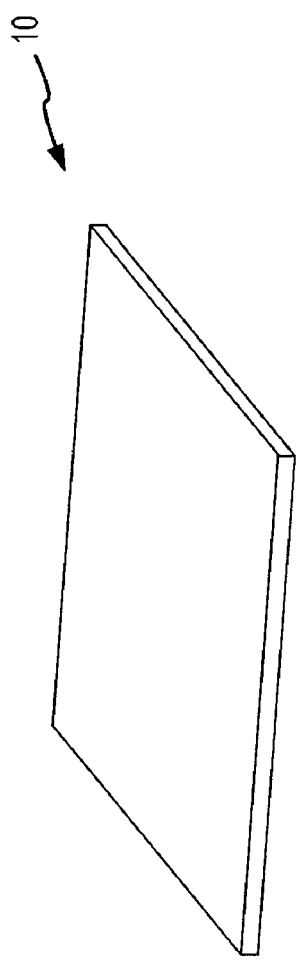
FIG. 1a illustrates a perspective view of a radio frequency absorber according to an embodiment of the present invention.
Figure 1B:
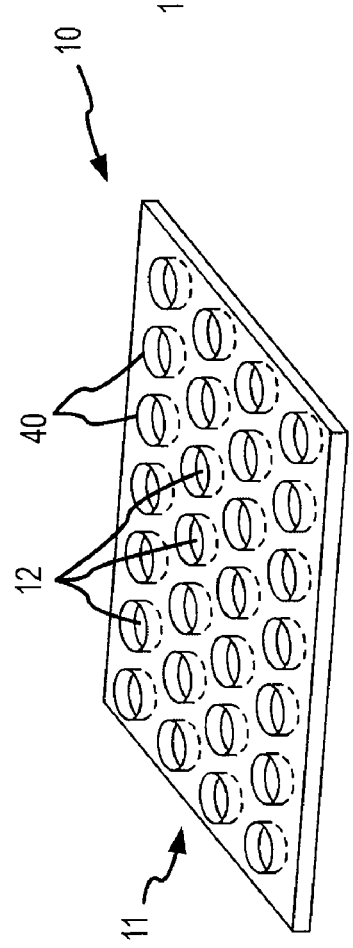
FIG. 1b illustrates a perspective view of a radio frequency absorber according to another exemplary embodiment of the present invention.

In accordance with various exemplary embodiments of the present invention, and with reference to FIGS. 1a-1c, a radio frequency absorber 10 ("RF absorber") is disclosed. RF absorber 10 comprises a substantially flat piece of a material that absorbs electromagnetic energy within the radio frequency portion of the electromagnetic spectrum. RF absorber 10 further comprises a plurality of holes 12 disposed within RF absorber 10. Holes 12 are configured to absorb electromagnetic energy incident on RF absorber 10. RF absorber 10, according to various embodiments of the invention, may be used in any application where the absorption of electromagnetic energy is desirable.

According to exemplary aspects of the present invention, RF absorber 10 comprises one or more absorptive materials. For example RF absorber 10 may comprise magnetically loaded materials, such as materials comprising ferrites and/or iron-based materials, dielectrically loaded materials, elastomers, epoxies, foams, silicones, and/or urethanes. Furthermore, RF absorber 10 may comprise any other absorptive material. In accordance with various exemplary embodiments of the invention, the type of material(s) selected for use in RF absorber 10 depends, at least in part, on the range of frequencies RF absorber 10 is configured to absorb. According to other exemplary embodiments, the absorptive material is configured to have a high permeability and/or high permittivity. In still other embodiments, any material that is operative to absorb electromagnetic energy may be used in RF absorber 10 without departing from the scope of the present invention.

According to further exemplary embodiments of the invention, absorptive materials for use in RF absorber 10 may be configured to have different textures. For example, the absorptive material may be configured to have the form of smooth sheets, partly-textured sheets, reticulated and/or open-celled sheets, foam sheets, and in liquid form that may be applied to a surface and then cured. In other exemplary embodiments, any texture that is configured to absorb electromagnetic energy may be employed in RF absorber 10 without departing from the scope of the present invention.

Figure 2A:
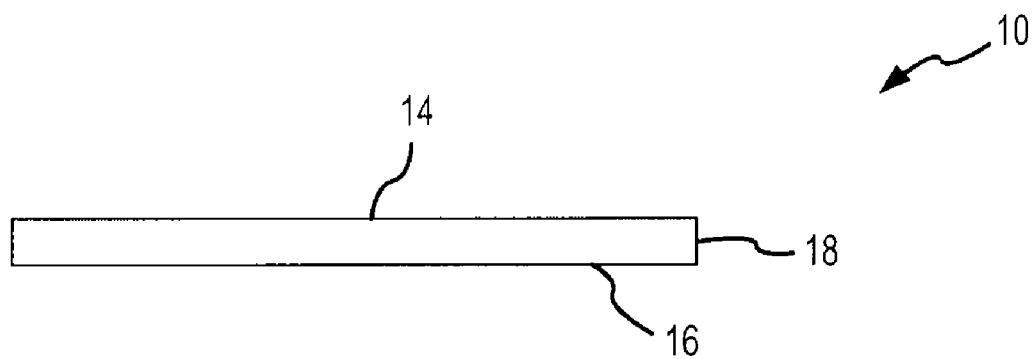
FIG. 2a illustrates a front view of a radio frequency absorber according to an exemplary embodiment of the present invention.
Figure 2B:
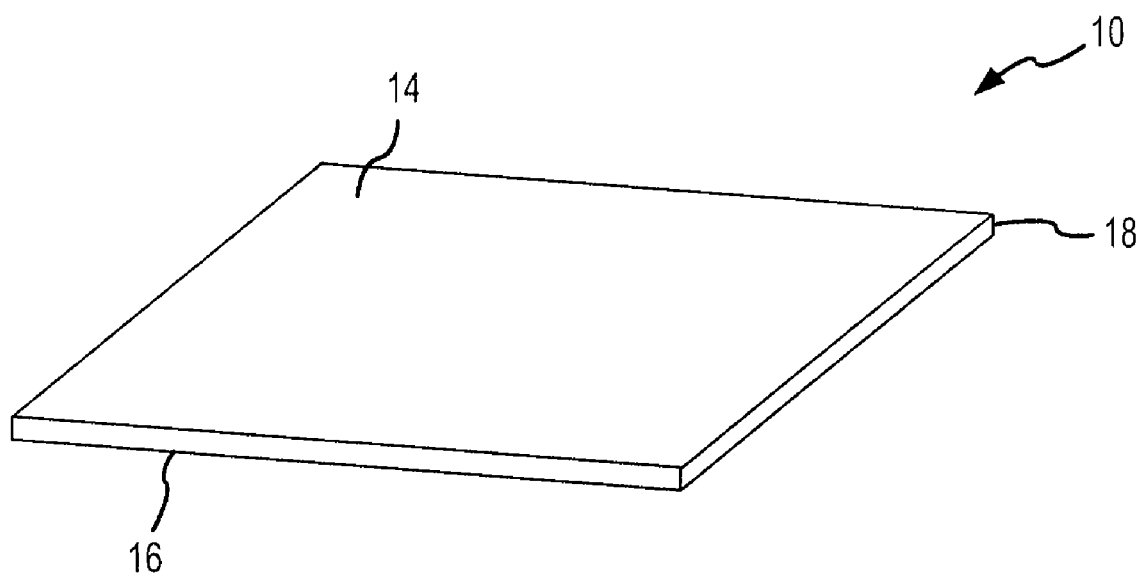
FIG. 2b illustrates a perspective view of a radio frequency absorber according to a further exemplary embodiment of the present invention.

In another exemplary embodiment of the invention, with reference to FIGS. 2a, 2b, RF absorber 10 comprises an absorbing surface 14 and an attachment surface 16 opposite absorbing surface 14. In some exemplary embodiments of the invention, the plane defined by absorbing surface 14 is substantially parallel to the plane defined by attachment surface 16, for example, where RF absorber 10 is a flat piece of absorptive material (see, e.g., FIGS. 2a, 2b). In still other exemplary embodiments of the invention, the two surfaces may not be parallel, where RF absorber 10 is not a flat piece of absorptive material, for example the surfaces may be stepped, slanted, sloped, uneven, bi-leveled, wavy and/or randomly shaped. In yet other exemplary embodiments, RF absorber 10 may be configured to have any geometric shape that is capable of absorbing electromagnetic energy.

According to further exemplary embodiments of the invention, the separation between absorbing surface 14 and attachment surface 16 define the thickness of RF absorber 10. In various exemplary embodiments of the invention, an absorber thickness 18 is determined at least in part by the frequency of the electromagnetic waves received by the RF absorber, the size of the RF absorber, and other design and environmental factors. For example, in exemplary embodiments, where the frequency of the electromagnetic waves is greater than 35 GHz, the RF absorber thickness may comprise the range of 10 mils to 30 mils. In other embodiments of the invention, where the frequency is greater than 18 GHz, the RF absorber is configured to be sufficiently thick to allow for the desired absorption. In further embodiments of the invention, the thickness may be any thickness configured to provide sufficient absorption, depending on the incident frequency and other operational parameters of the RF absorber. Furthermore, other exemplary aspects of the invention provide that thickness 18 varies across RF absorber 10.

Figure 3A:
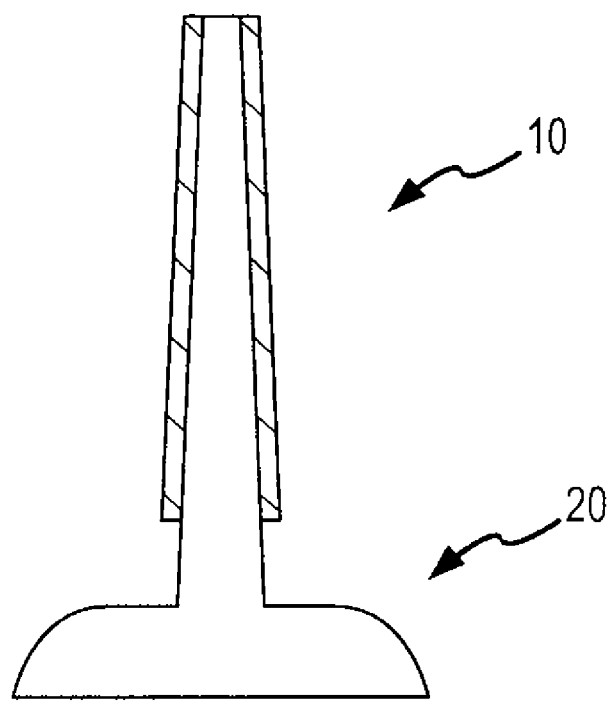
FIG. 3a illustrates a cross sectional view of a radio frequency absorber and an antenna according to an exemplary embodiment of the present invention.
Figure 3B:
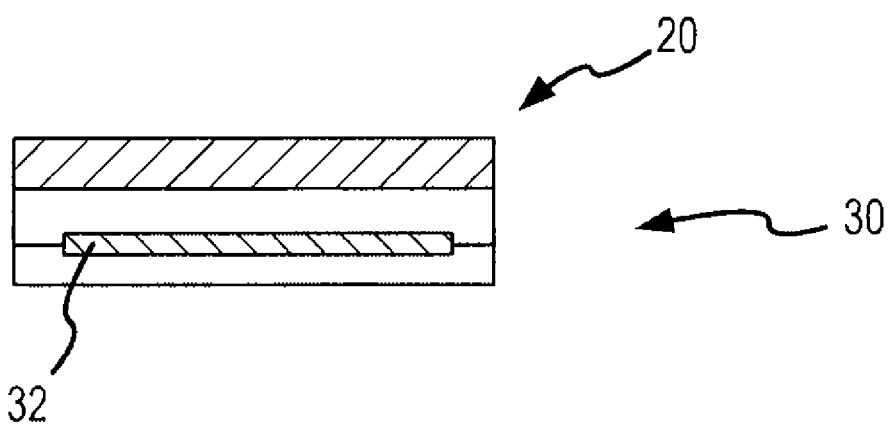
FIG. 3b illustrates a cross sectional view of a radio frequency absorber and an integrated circuit cavity according to another exemplary embodiment of the present invention.

In accordance with a further exemplary embodiment of the invention, absorbing surface 14 is configured to receive the electromagnetic energy and/or waves, and attachment surface 16 is configured to facilitate the attachment of RF absorber 10 to another surface. For example, with reference to FIGS. 3a and 3b, in various embodiments of the invention, RF absorber 10 may be attached to an external surface, such as an antenna 20, or an internal surface, such as within a device 30 that houses an integrated circuit 32. In other exemplary embodiments, RF absorber 10 may be applied to any surface that receives electromagnetic radiation.

In accordance with a further exemplary embodiment of the present invention, the plurality of holes 12 disposed within RF absorber 10 increases the absorptive properties, functionalities and/or capabilities of RF absorber 10. The plurality of holes may be arranged in any manner within RF absorber 10. In one exemplary embodiment, holes 12 are arranged in a repeating pattern. For example, with reference again to FIGS. 1b and 1c, in certain embodiments holes 12 are arranged in an aligned grid 11. In other embodiments, holes 12 are arranged in a staggered formation 13. In another exemplary embodiment, holes 12 are spaced 30 mils apart from each other. In still other embodiments, holes 12 are arranged in a circular pattern, a pattern with more concentrated areas of holes and less concentrated areas of holes, and/or a random pattern of holes. In further embodiments, the holes may be arranged in any manner within the RF absorber that aids the RF absorber in absorbing the electromagnetic energy.

Figure 4:
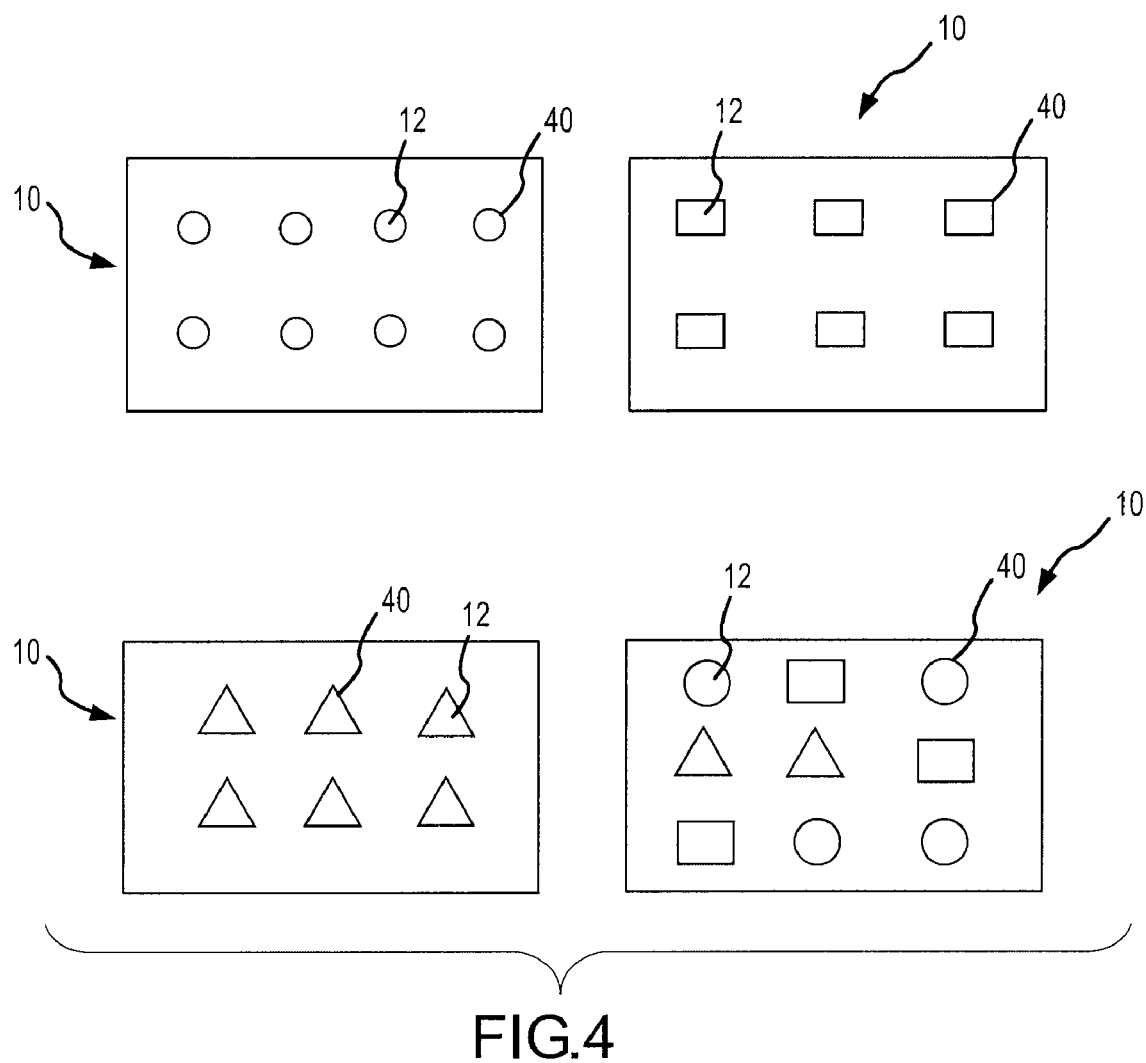
FIG. 4 illustrates a number of top views of a radio frequency absorbers according to exemplary embodiments of the present invention.

In accordance with other exemplary embodiments of the invention, holes 12 are configured to have signal receiving openings and or hole openings 40 of different shapes. For example, with continued reference to FIGS. 1b, 1c, in an exemplary embodiment, hole openings 40 are substantially circular. In other exemplary embodiments of the invention, and with reference to FIG. 4, hole openings 40 are rectangular, oval-shaped, triangular, and/or shaped according to any other geometric figure or random figure. In yet other exemplary embodiments, some hole openings may comprise one shape, while other hole openings may comprise a different shape with the same RF absorber 10. For example, some hole openings may be circular and other hole openings may be other geometric shapes within the same RF absorber 10. In further exemplary embodiments, hole openings 40 are configured to increase the absorptive and/or scattering properties of RF absorber 10. For example, in exemplary embodiments, hole openings 40 are configured to be circular to increase the absorptive and/or scattering properties of RF absorber 10. In yet another exemplary embodiment, hole openings 40 are configured to be circular, with a diameter of 70 mils, where the operating radio frequency comprises a frequency greater than or equal to 35 GHz.

In an exemplary embodiment of the invention, the surface area of hole openings 40 is a certain percentage of the total surface area of RF absorber 10. For example, the percentage of total surface area that hole openings 40 comprise may be approximately 41%, or comprise the range 30% to 60%. Such a percentage or range of percentages is based on, among other things, the frequency of the electromagnetic signal, the environment in which RF absorber 10 is present, and/or the material composition of the RF absorber material.

Figure 5:
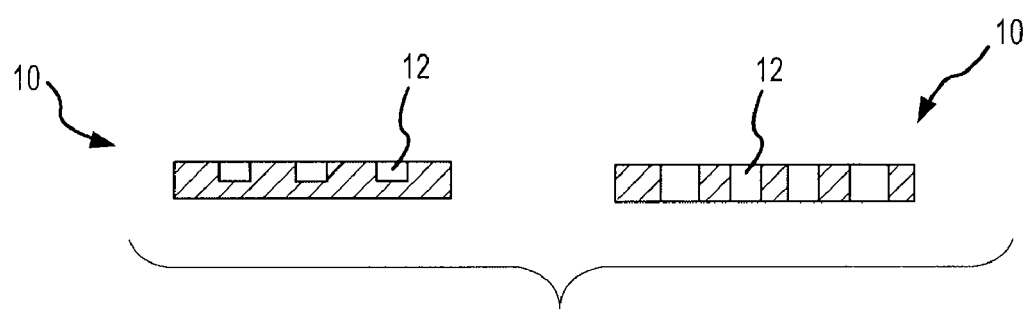
FIG. 5 illustrates cross sectional views of radio frequency absorbers according to exemplary embodiments of the present invention.

In still other exemplary embodiments of the invention, and with reference to FIG. 5, each hole 12 has a hole depth and a hole width. It should be noted that different holes have different shapes, for example, cylinders, boxes, pyramids, prisms, etc., and not all of these shapes necessarily have a width, per se, or they may have a width that varies. Therefore, according to the exemplary embodiments of the invention disclosed herein, "width" refers to a measurement of a cross section of a particular hole. The measurement is made by constructing a horizontal line from one edge of the cross-section to an opposite edge of the cross-section. Thus, according to one exemplary embodiment of the invention, where the hole is configured to be a pyramid-shape, the cross-sectional "width" of the pyramid varies depending on the vertical location within the hole that the horizontal measuring line is drawn. Thus, according to various exemplary embodiments of the invention, holes 12 may be configured to be any shapes, with any dimensions, that are disposable within RF absorber 10, and that are configured to absorb electromagnetic energy.

In another exemplary embodiment of the invention, the hole depth is the same as the RF absorber thickness: i.e., the hole goes all the way through the RF absorber. In such an embodiment, it would be possible for an electromagnetic signal incident on hole 12 to reflect off a surface to which RF absorber 10 is attached. In other embodiments, the hole depth is less than the RF absorber thickness. In such an embodiment, an electromagnetic signal incident on hole 12 will only reflect within hole 12 off the absorptive material of RF absorber 10. In still other exemplary embodiments, hole 12 may have any depth that is configured to absorb electromagnetic energy.

Figure 6:
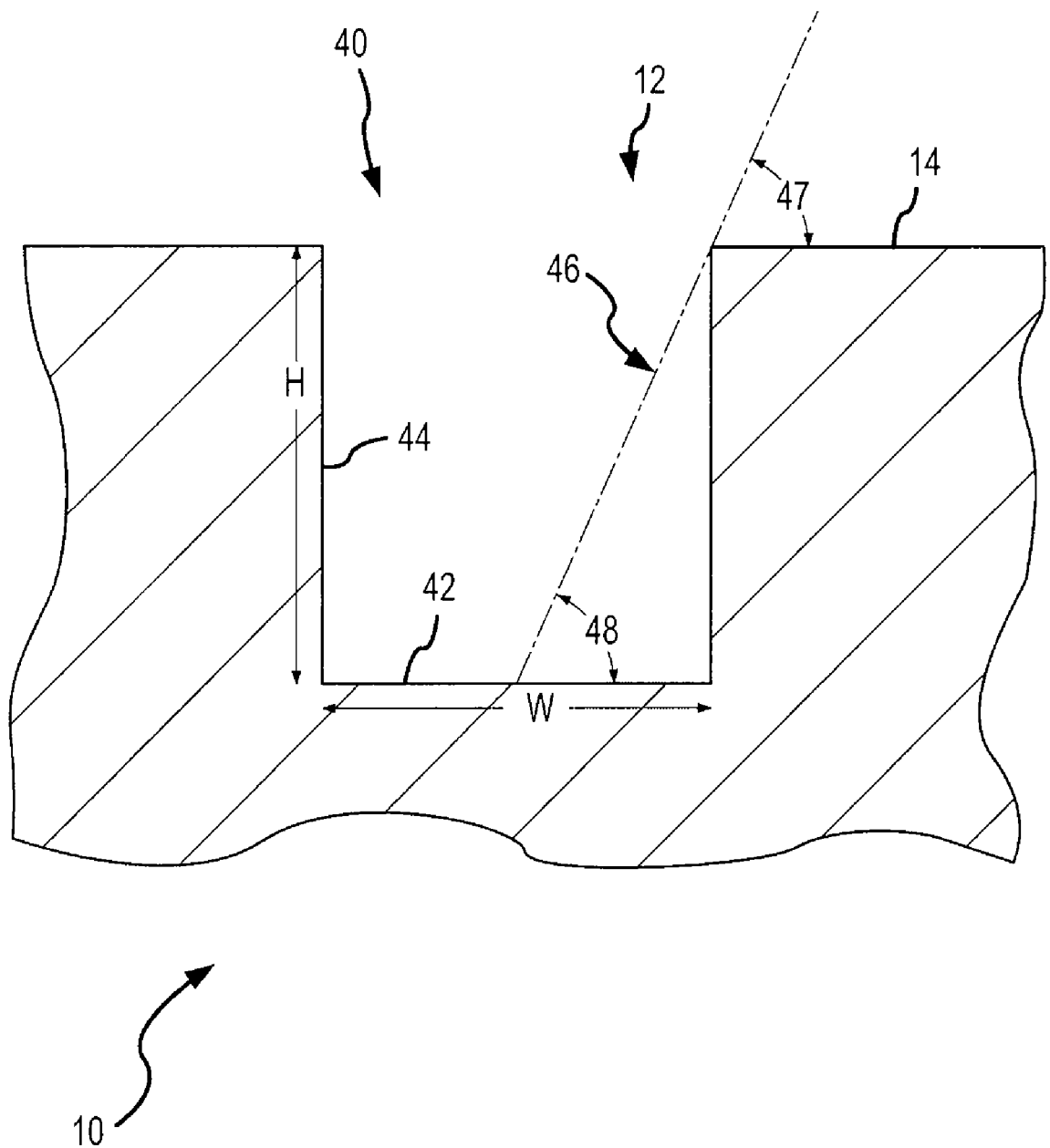
FIG. 6 illustrates a cross sectional, cut-away view of a radio frequency absorber with geometric indications according to another exemplary embodiment of the present invention.
Figure 7:
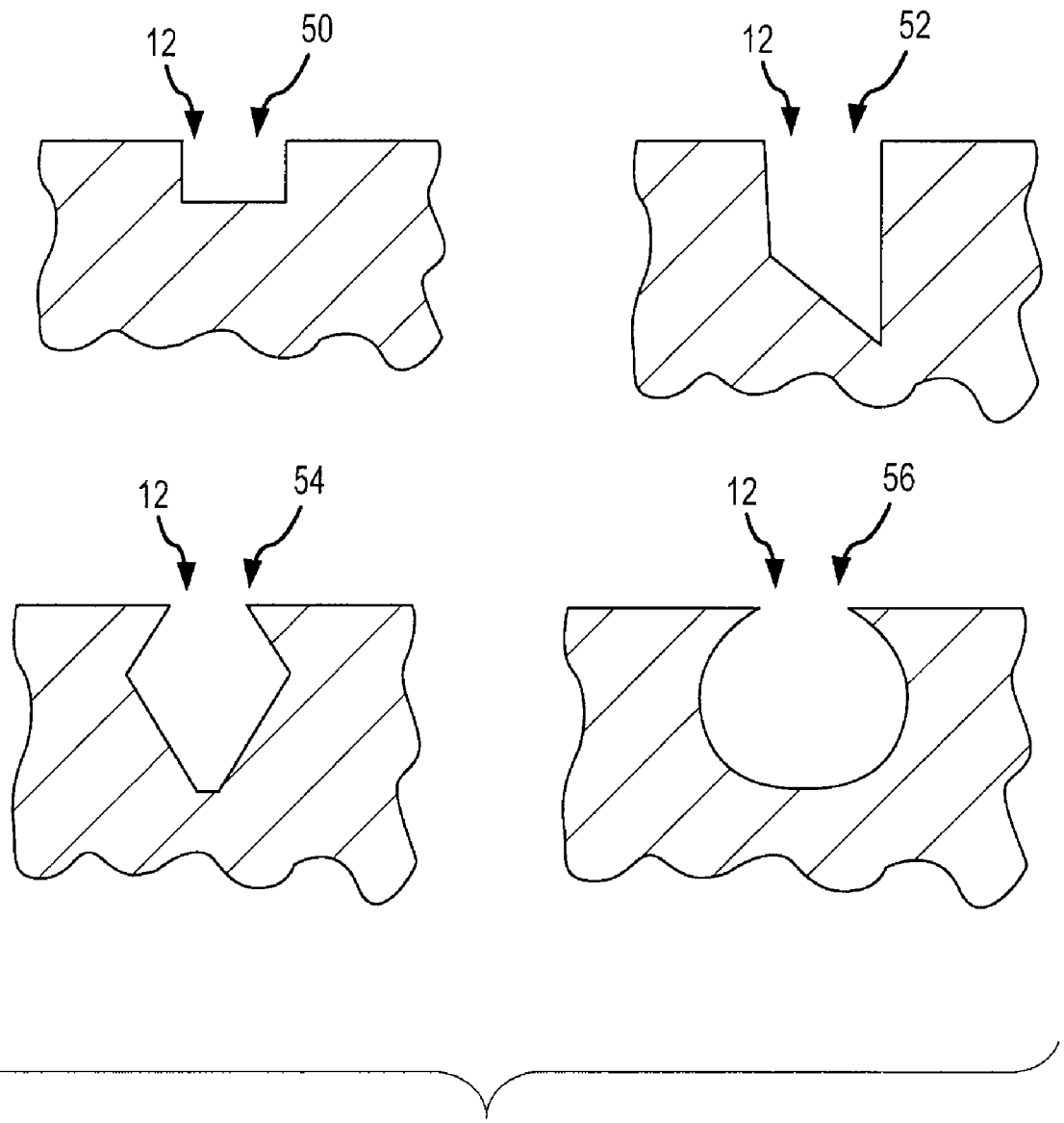
FIG. 7 illustrates cross sectional, cut-away views of radio frequency absorbers according to further exemplary embodiments of the present invention.

In further exemplary embodiments of the invention, and with reference to FIG. 6, each hole 12 is defined by a plurality of surfaces. For example, in an exemplary embodiment, each hole comprises a signal receiving opening and or hole opening 40, a first signal receiving surface and/or bottom surface 42 and a second signal receiving surface and/or wall surface 44. In some exemplary embodiments, where hole 12 goes all the way through RF absorber 10, bottom surface 42 may comprise the material to which RF absorber 10 is attached. In other exemplary embodiments, bottom surface 42 is connected to wall surface 44, which is connected to hole opening 40 to define hole 12 disposed within RF absorber 10. Where hole openings 40 are substantially circular, bottom surface 42 and wall surface 44 may define cylinder-shaped holes. In such an embodiment, the plane defined by bottom surface 42 may be parallel to the plane defined by absorbing surface 14 of RF absorber 10 and/or may be parallel to the plane defined by hole opening 40. For example, in an exemplary embodiment where RF absorber 10 is configured to be 30 mils thick, hole 12 may go all the way through RF absorber 10, and hole 12 may be configured to have a diameter of 70 mils.

In accordance with an exemplary embodiment of the invention, and with reference again to FIG. 6, the geometry of the holes 12 is configured to increase internal reflections of the electromagnetic waves within the holes. For example, in FIG. 6, a cross-section of an exemplary hole 12 is shown to facilitate the description of the geometry of the hole. In this embodiment, where the hole width is configured to be substantially constant throughout the hole, the hole height, H, of wall surface 44, and the hole width, W, of bottom surface 42 define a substantially rectangular shape. A line 46 drawn from the top right corner of the rectangle to the midpoint, W/2, of the bottom surface creates an internal angle 48 within the hole. The internal angle may be calculated by taking the inverse tangent of the quotient of H divided by half of W. This internal angle is that angle at which an electromagnetic signal, if it were incident on the hole at such an angle, and at the edge of hole opening 40, would reflect off the bottom surface and exit the hole without hitting the wall surface. The magnitude of such an internal angle may vary from embodiment to embodiment depending on different variables, such as absorber material, the angle of incident electromagnetic radiation 47 and/or electromagnetic signal frequency. According to exemplary embodiments, the internal angle is configured to be approximately 40 degrees, for example, where W is 70 mils and H is 30 mils. In certain exemplary embodiments, the internal angle 48 may not be calculated as discussed above, but may comprise a different angle configured to increase the absorptive properties of RF absorber 10. In further embodiments of the invention, internal angle 48 may comprise any angle configured to facilitate absorption of electromagnetic energy by RF absorber 10.

In accordance with an exemplary embodiment of the invention, and with reference again to FIG. 6, the geometry of the holes 12 is configured to increase internal reflections of the electromagnetic waves within the holes. For example, in FIG. 6, a cross-section of an exemplary hole 12 is shown to facilitate the description of the geometry of the hole. In this embodiment, where the hole width is configured to be substantially constant throughout the hole, the hole height, H, of wall surface 44, and the hole width, W, of bottom surface 42 define a substantially rectangular shape. A line 46 drawn from the top right corner of the rectangle to the midpoint, W/2, of the bottom surface creates an internal angle 48 within the hole. The internal angle may be calculated by taking the inverse tangent of the quotient of H divided by half of W. This internal angle is that angle at which an electromagnetic signal, if it were incident on the hole at such an angle, and at the edge of hole opening 40, would reflect off the bottom surface and exit the hole without hitting the wall surface. The magnitude of such an internal angle may vary from embodiment to embodiment depending on different variables, such as absorber material, the angle of incident electromagnetic radiation and/or electromagnetic signal frequency. According to exemplary embodiments, the internal angle is configured to be approximately 40 degrees, for example, where W is 70 mils and H is 30 mils. In certain exemplary embodiments, the internal angle 48 may not be calculated as discussed above, but may comprise a different angle configured to increase the absorptive properties of RF absorber 10. In further embodiments of the invention, internal angle 48 may comprise any angle configured to facilitate absorption of electromagnetic energy by RF absorber 10.

Figure 8A:
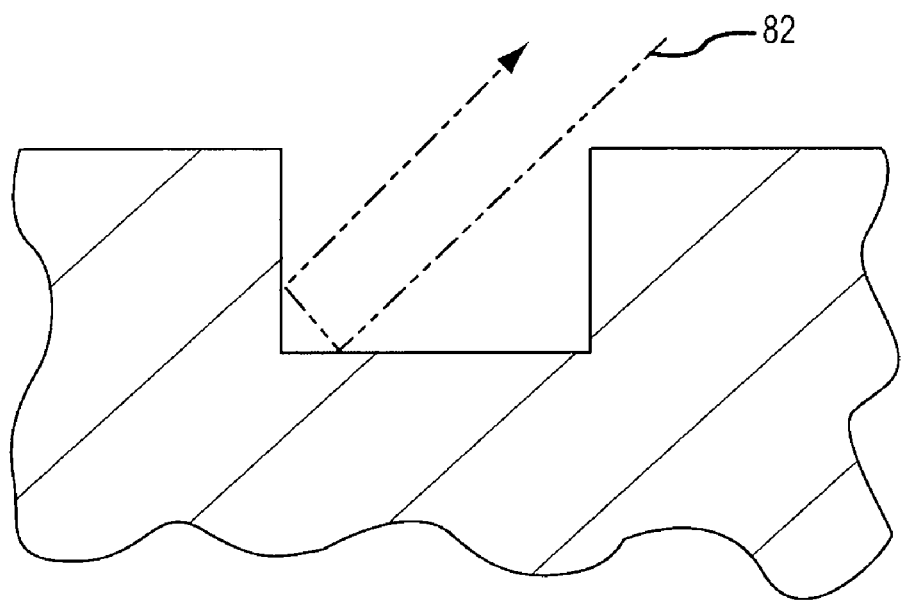
FIG. 8a illustrates a cross sectional, cut-away view of a radio frequency absorber with lines indicating signal reflections according to an exemplary embodiment of the present invention.
Figure 8B:
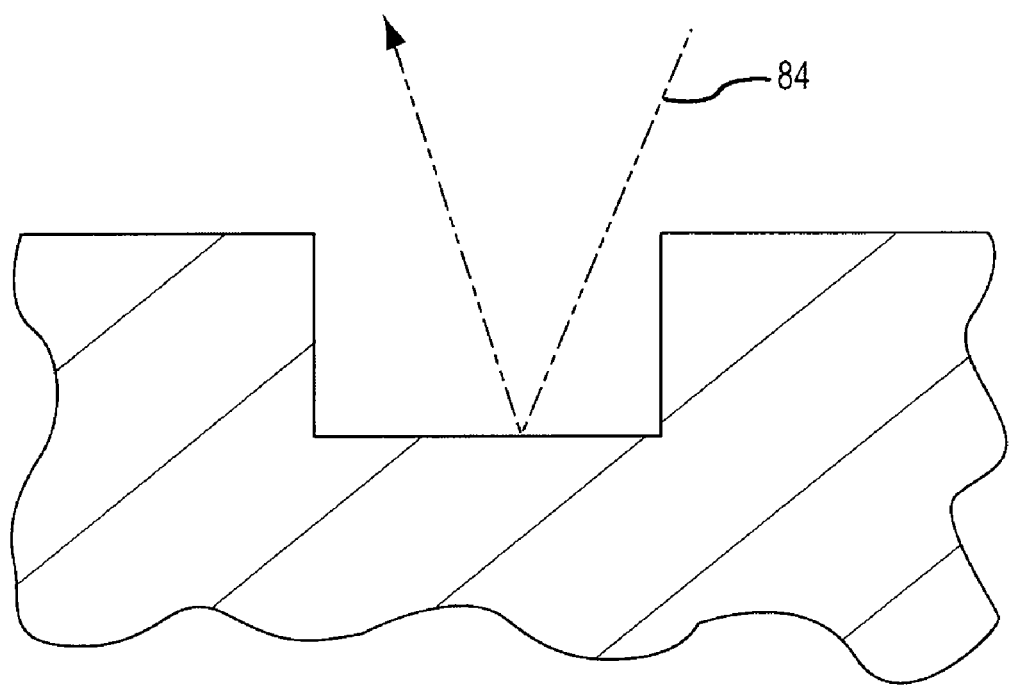
FIG. 8b illustrates a cross sectional, cut-away view of a radio frequency absorber with lines indicating signal reflections according to another exemplary embodiment of the present invention.

Exemplary embodiments of the present invention provide an internal angle that is configured to be sufficiently large to allow for the electromagnetic signals to reflect within the hole. For example, with reference to FIG. 8a, where the electromagnetic wave 82 reflects within the hole, it contacts the RF absorber material more times, with a certain amount of energy absorbed with each contact, and the RF absorber thus absorbs more energy than it would without the holes, or where the electromagnetic wave 84 only contacts the RF absorber once, as in FIG. 8b. Such an embodiment, as in FIG. 8a, also absorbs more energy than when the hole goes all the way through the RF absorber material (see, e.g., FIG. 5) and is configured such that an RF signal reflects off the material to which the RF absorber is attached and exits the hole without contacting the RF absorber. Therefore, according to an exemplary embodiment of the invention, it is desirable to have a hole with the ratio of H to W that increases the likelihood of multiple reflections within the hole. For example, in an exemplary embodiment, where the RF absorber thickness is configured to be approximately 30 mils, and holes 12 go all the way through RF absorber 10, and the operating frequency is configured to be greater than or equal to 35 GHz, W is configured to be approximately 70 mils, resulting in an H to W ratio of 0.43. In further embodiments of the invention, the ratio of H to W is configured to be any ratio that aids in absorbing electromagnetic energy.

According to further exemplary embodiments, the hole is configured to maximize the number of internal reflections that occur within the hole. For example, a blackbody cavity absorbs all electromagnetic radiation that is incident on it.

Thus, such a cavity would maximize the number of internal reflections that occur within the hole. Configurations other than a blackbody, according to exemplary embodiments of the invention, allow for multiple reflections within the hole and thus increase the absorptive properties of RF absorber 10. Any hole configuration that increases the internal reflections within the hole is within the scope of the various embodiments of the present invention.

According to various exemplary embodiments of the invention, the hole width is configured to be sufficiently large to increase the absorptive properties of RF absorber 10. In a particular exemplary embodiment, the hole width is configured to be larger than one-quarter of the wavelength of the operating frequency. Those skilled in the art are able to calculate the length of a one-quarter wavelength based on a given frequency. For example, where the operating frequency is configured to be 45 GHz, one-quarter wavelength would have a length of approximately 66 mils. Thus, according to an exemplary embodiment, holes 12 may be configured to have a hole width larger than one-quarter wavelength, for example, the hole width may be configured to be 70 mils.

Figure 9:
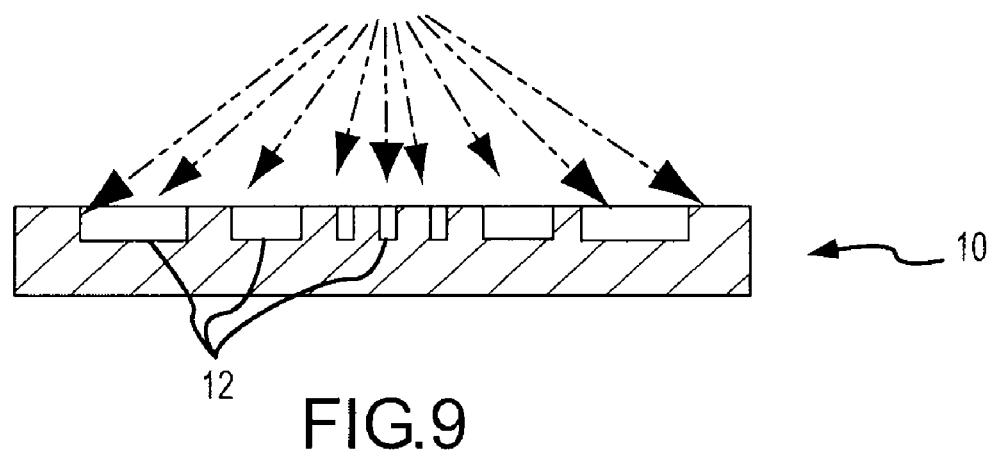
FIG. 9 illustrates a cross sectional view of a radio frequency absorber with lines indicating incident signal directions according to an exemplary embodiment of the present invention.

In other exemplary embodiments, RF absorber 10 may receive electromagnetic waves at multiple incident angles. In such embodiments, and with reference to FIG. 9, the size, shape, and or configuration of the holes may be configured to account for variations in the incident angle. For example, at one point of the RF absorber, the incident angle may approach 90 degrees, whereas at other points the incident angle may approach zero degrees. If such a distribution is known, holes with a larger ratio of H to W can be placed where the incident angle approaches 90 degrees, and holes with a smaller ratio of H to W may be used where the incident angle approaches zero. In other embodiments, holes with a greater likelihood of multiple reflections may be placed where the incident angle approaches 90 degrees.

In accordance with exemplary embodiments of the present invention, any method now known or hereafter discovered to provide holes 12 in RF absorber 10 may be employed to create the holes disclosed herein. For example, holes 12 may be drilled in the absorber material. In other embodiments, the holes may be formed at the same time the RF absorber is formed. In other embodiments of the invention, the holes may be formed by etching, leaching, and the like. In still other embodiments of the invention, the RF absorber with the holes may be formed by injection molding, casting, lamination of layers of RF absorber material, and any method now known or hereafter devised for manufacturing RF absorbers.

Figure 10:
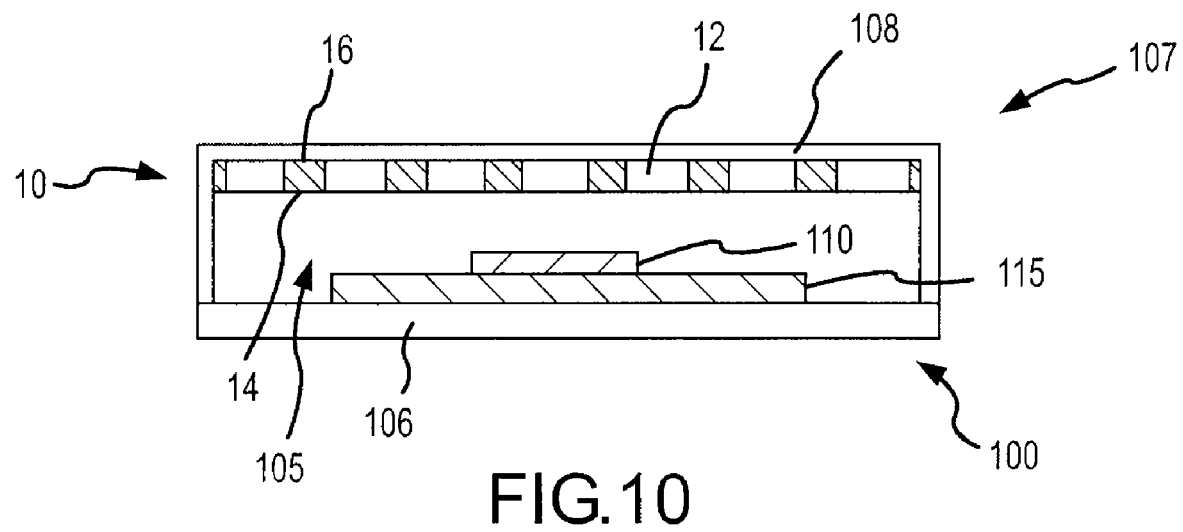
FIG. 10 illustrates a cross sectional view of a radio frequency absorber disposed within an integrated circuit cavity according to an exemplary embodiment of the present invention.

As discussed above, RF absorber 10 according to various exemplary embodiments of the present invention may be used wherever electromagnetic energy is present, and where it is desirable to absorb, scatter, and/or attenuate that electromagnetic energy. According to an exemplary embodiment of the present invention, and with reference to FIG. 10, RF absorber 10 may be used within an integrated circuit device 100 that houses a monolithic microwave integrated circuit ("MMIC") 110. Device 100 comprises a device housing 107, that comprises a base 106, and a lid 108 configured to enclose MMIC 110 within device 100. Base 106 is configured to support an active surface 115, and MMIC 110 is disposed within and/or proximate to active surface 115. RF absorber 10 is disposed within lid 108 and is configured to be opposite active surface 115 and MMIC 110. RF absorber 10 comprises attachment surface 16, absorbing surface 14, and a plurality of holes 12. According to further exemplary embodiments, RF absorber 10 attachment surface 16 is configured to be proximate to and connected to lid 108, and absorbing surface 14 is configured to be opposite active surface 115 and MMIC 110. A device cavity 105 is formed within device 100, and is configured to be the space between RF absorber 10 and MMIC 110, within device housing 107.

MMIC 110 operates at various frequencies in the microwave range of the electromagnetic spectrum, for example, from 3 GHz to more than 100 GHz; however, other devices with operating frequencies outside of that range may also employ embodiments of the present invention to absorb electromagnetic energy. In an exemplary embodiment of the invention, MMIC 110 operates at frequencies greater than 35 GHz.

According to another exemplary embodiment of the invention, integrated circuit device 100, such as an MMIC amplifier, is configured to amplify radio frequency signals to a desired level. When MMIC 110 is located within device cavity 105 and the radio frequency signals are applied to MMIC 110, frequency oscillations, cavity resonances, and/or cavity modes may occur within the cavity. Such oscillations, together with undesirable cavity resonances may lead to irregular gain, irregular power performance, and other undesirable effects. For example, device housing 107 may be constructed out of metal. Electromagnetic energy within the cavity will reflect off metal device housing 107 and interfere with the operation of MMIC 110. Therefore, it is desirable to use RF absorber 10 according to various embodiments of the present invention to absorb, attenuate, scatter and/or otherwise modify the electromagnetic energy within the cavity. Such modification of the electromagnetic energy aids in increasing the effectiveness of the performance of MMIC 110.

In exemplary embodiments of the invention, RF absorber 10 is configured to have a thickness depending on the operating frequency of MMIC 110 and other operating parameters. For example, where the operating frequency is 30 GHz, and the distance between MMIC 110 and device lid 107 is 40 mils, RF absorber 10 may comprise a thickness of 20 mils. In other situations, RF absorber 10 may comprise a thickness of 10 to 30 mils, for example, where the operating frequency comprises the range 42 GHz to 47 GHz, and in yet other embodiments, the thickness of the RF absorber is less than one millimeter. In further embodiments, the thickness of RF absorber 10 may be smaller or greater depending on the application for RF absorber 10.

In exemplary embodiments, the RF absorber absorbing surface 14 is located a certain distance from MMIC 110 in order to aid in minimizing loss to the normal power and gain of MMIC 110. For example, according to one embodiment of the invention, where the distance between the MMIC and the cavity housing is 40 mils, the RF absorber is 20 mils thick, and the distance between the RF absorber absorbing surface and MMIC 110 is 20 mils. In other embodiments of the invention, the RF absorber is configured and placed within device cavity 105 to minimize loss to the power and gain of the integrated circuit. For example, where the distance between RF absorber 10 and MMIC 110 is too small, the power output and gain from the integrated circuit device 100 is reduced. Although an MMIC amplifier has been disclosed, embodiments of the present invention may be used in other integrated circuit devices comprising device cavities that operate at other frequencies. Further embodiments of the invention provide RF absorber 10 configured to absorb electromagnetic radiation wherever such radiation is incident on a surface.

In the foregoing specification, the invention has been described with reference to specific embodiments. However, it should be appreciated that various modifications and changes may be made without departing from the scope of the present invention. The specification and figures are to be regarded in an illustrative manner, rather than a restrictive one, and all such modifications are intended to be included within the scope of present invention. Accordingly, the scope of the invention should be determined by the appended claims and their legal equivalents, rather than by the examples given above.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical".

The invention claimed is:

1. An integrated circuit device that houses an integrated circuit, comprising:
    an active surface comprising the integrated circuit;
    a device lid configured to create a device cavity, said device cavity comprising a space defined by said active surface and a lid surface opposite said active surface, wherein said lid surface is located a cavity separation distance from said active surface; and
    an absorber proximate said lid surface, wherein said absorber has an absorber thickness, and wherein said absorber comprises:
        an attachment surface proximate said lid surface;
        an absorbing surface opposite said attachment surface and located an absorber surface distance from said attachment surface;
        a hole disposed within said absorber, wherein said hole has a hole depth and a hole cross sectional width; and
        wherein said absorber is primarily resistive and is configured to absorb electromagnetic signals.

2. An integrated circuit device according to claim 1, wherein said absorber thickness is equal to said absorber surface distance, and wherein said hole depth is equal to said absorber thickness.

3. An integrated circuit device according to claim 1, wherein said hole depth is less than said absorber thickness.

4. An integrated circuit device according to claim 1, wherein said absorber thickness is less than one millimeter.

5. An integrated circuit device according to claim 1, wherein said absorber thickness comprises the range 10 mils to 30 mils.

6. An integrated circuit device according to claim 1, wherein said hole is defined by:
    a signal receiving opening coplanar with said absorbing surface;
    a first signal receiving surface opposite said signal receiving opening;
    a second signal receiving surface connecting said signal receiving opening and said first signal receiving surface; and
    an internal angle of reflection defined by said first and second signal receiving surfaces.

7. An integrated circuit device according to claim 6, wherein the integrated circuit generates a radio frequency signal, and wherein the radio frequency signal is incident on said signal receiving opening at an incident angle, wherein said incident angle is less than said internal angle of reflection.

8. An integrated circuit device according to claim 6, wherein said first signal receiving surface comprises at least one of said lid surface and a portion of said absorber.

9. An integrated circuit device according to claim 6, wherein the integrated circuit comprises an operating frequency greater than 18 GHz.

10. An integrated circuit device according to claim 6, wherein the integrated circuit comprises an operating frequency greater than 35 GHz.

11. An integrated circuit device according to claim 6, wherein said signal receiving opening is at least one of a parallelogram, a triangle, a trapezoid, a hexagon, an octagon a substantially circular shape, and an oval.

12. An integrated circuit device according to claim 1, wherein said absorber comprises a plurality of holes, wherein a total hole surface area comprises a percentage of a total absorber surface area, wherein said percentage of said total hole surface area comprises the range 30% to 60%.

13. An integrated circuit device according to claim 12, wherein said percentage is 41%.

14. An integrated circuit device according to claim 1, wherein said hole comprises a tapered hole.

15. An integrated circuit device according to claim 1, wherein said hole cross sectional width is variable.

16. An integrated circuit device according to claim 12, wherein said plurality of holes is arranged within said absorber by at least one of the following methods: (i) according to an aligned grid; (ii) according to a staggered grid; and (iii) according to a random distribution.

17. An integrated circuit device according to claim 6, wherein said internal angle of reflection comprises an angle greater than forty degrees.

18. An integrated circuit device according to claim 6, wherein said hole depth divided by said hole cross-sectional width comprises the range of values greater than or equal to 0.4.

19. A radio frequency absorber, comprising:
    an absorber material having an absorber thickness;
    an attachment surface;
    an absorbing surface opposite said attachment surface, wherein said absorbing surface is primarily resistive; and
    a hole disposed within said absorber material, wherein said hole comprises:
        an opening disposed within said absorbing surface;
        a first signal receiving surface opposite said opening; and
        a second signal receiving surface adjoining said opening and said first signal receiving surface.

20. A radio frequency absorber according to claim 19, wherein said absorber thickness is less than one millimeter.

21. A radio frequency absorber according to claim 19, wherein said hole further comprises a second opening disposed within said attachment surface, wherein said second signal receiving surface adjoins said opening and said second opening, such that said hole continues entirely through said absorber, such that when said attachment surface is connected to a connecting surface, said first signal receiving surface comprises said connecting surface.

22. An amplifier configured to reduce cavity resonances associated with a microwave signal within an amplifier device cavity, comprising:

an active surface comprising an integrated circuit configured to operate at a frequency greater than or equal to 35 GHz;

a microwave signal absorber comprising an absorber thickness, wherein said microwave signal absorber further comprises a primarily resistive absorbing surface and an attachment surface, wherein said absorber is configured to absorb microwave signals, wherein the microwave signal is incident on said absorbing surface at an incident angle; and a hole disposed within said microwave signal absorber, said hole comprising:

an opening coplanar with said absorbing surface, wherein said opening is configured to receive the microwave signal; and a hole connected to said opening, wherein said hole comprises a hole depth and a hole cross sectional width, wherein said hole receives the microwave signal.

23. An amplifier according to claim 22, further comprising an internal angle within said hole, wherein said internal angle is defined by the inverse tangent of two times said hole depth divided by said hole width.

24. An amplifier according to claim 23, wherein said internal angle is greater than the incident angle of the microwave signal.

25. An amplifier according to claim 23, wherein said internal angle is greater than forty degrees.

26. An amplifier according to claim 22, wherein said hole comprises a blackbody cavity.

27. An amplifier according to claim 22, wherein said integrated circuit comprises a monolithic microwave integrated circuit.

28. An amplifier according to claim 22, wherein said opening comprises an opening width, and wherein said frequency comprises a one-quarter wavelength dimension, said opening width being greater than said one-quarter wavelength dimension of said frequency.

29. An amplifier according to claim 28, wherein said frequency comprises 45 GHz, wherein said one-quarter wavelength dimension comprises the length of approximately 66 mils, wherein said opening width is greater than or equal to 66 mils, and wherein said hole depth comprises the length of 10 to 30 mils.

30. An integrated circuit device according to claim 12, wherein said plurality of holes are disconnected from each other.

31. An integrated circuit device according to claim 12, wherein said plurality of holes is arranged within said absorber according to a non-periodic distribution.

32. An integrated circuit device according to claim 1, wherein said absorber partially overlaps the integrated circuit in co-planar manner.

33. An integrated circuit device according to claim 32, wherein said absorbing surface is a separation distance from said active surface.

34. An integrated circuit device according to claim 1, wherein said lid surface is primarily reflective.

* * * * *